United States Patent
Logvinov

(10) Patent No.: US 9,900,051 B2
(45) Date of Patent: Feb. 20, 2018

(54) SYSTEM AND METHOD FOR A POWER LINE MODEM

(71) Applicant: STMicroelectronics, Inc., Coppell, TX (US)

(72) Inventor: Oleg Logvinov, East Brunswick, NJ (US)

(73) Assignee: STMICROELECTRONICS, INC., Coppell, TX (US)

( * ) Notice: Subject to any disclaimer, the term of this patent is extended or adjusted under 35 U.S.C. 154(b) by 202 days.

(21) Appl. No.: 14/825,979

(22) Filed: Aug. 13, 2015

(65) Prior Publication Data

US 2015/0349845 A1 Dec. 3, 2015

Related U.S. Application Data

(63) Continuation of application No. 13/656,369, filed on Oct. 19, 2012, now Pat. No. 9,130,657.

(51) Int. Cl.
| | | |
|---|---|---|
| *H04B 3/54* | (2006.01) | |
| *H05B 37/02* | (2006.01) | |
| *H04W 52/00* | (2009.01) | |
| *H04W 92/00* | (2009.01) | |
| *H04W 8/00* | (2009.01) | |
| *H04W 88/18* | (2009.01) | |

(52) U.S. Cl.
CPC ............ *H04B 3/54* (2013.01); *H05B 37/0263* (2013.01); *H03K 2217/00* (2013.01); *H03K 2217/0009* (2013.01); *H03K 2217/0036* (2013.01); *H04W 8/00* (2013.01); *H04W 52/00* (2013.01); *H04W 88/18* (2013.01); *H04W 92/00* (2013.01)

(58) Field of Classification Search
CPC .................. H04B 3/54; H05B 37/0263; H03K 2217/0036; H03K 2217/0009; H03K 2217/00; H04W 88/18; H04W 52/00; H04W 8/00; H04W 92/00
See application file for complete search history.

(56) References Cited

U.S. PATENT DOCUMENTS

| | | | | |
|---|---|---|---|---|
| 4,804,938 A | * | 2/1989 | Rouse | ....................... H02J 3/14 307/11 |
| 5,148,144 A | * | 9/1992 | Sutterlin | ................ H04B 3/548 340/12.36 |

(Continued)

FOREIGN PATENT DOCUMENTS

| | | |
|---|---|---|
| CN | 101669735 A | 4/2010 |
| CN | 102714521 A | 10/2012 |

(Continued)

OTHER PUBLICATIONS

Chinese Search Report, dated Jun. 12, 2016, for Chinese Application No. 201310378542.8, 2 pages.

(Continued)

*Primary Examiner* — Ramesh Patel
(74) *Attorney, Agent, or Firm* — Seed IP Law Group LLP

(57) ABSTRACT

In accordance with an embodiment, a method of operating an electronic system includes detecting an incoming transmission on a power line, and modifying a switching behavior of a switched-mode power supply coupled to the power line upon detecting the incoming transmission. Modifying reduces the level of interference produced by the switched-mode power supply.

10 Claims, 5 Drawing Sheets

(56) References Cited

U.S. PATENT DOCUMENTS

| | | | | |
|---|---|---|---|---|
| 5,581,229 | A * | 12/1996 | Hunt | G01R 31/44 340/12.32 |
| 6,917,888 | B2 * | 7/2005 | Logvinov | H04B 3/54 324/512 |
| 7,106,177 | B2 * | 9/2006 | Logvinov | H04B 3/542 370/203 |
| 7,193,506 | B2 * | 3/2007 | Logvinov | H04B 3/54 340/12.32 |
| 7,193,579 | B2 * | 3/2007 | Qi | H01Q 9/20 343/793 |
| 7,245,625 | B2 * | 7/2007 | Manis | H04B 3/54 340/12.33 |
| 7,286,812 | B2 * | 10/2007 | Manis | H04B 3/56 455/14 |
| 7,369,579 | B2 * | 5/2008 | Logvinov | H04B 3/542 340/12.32 |
| 7,683,777 | B2 * | 3/2010 | Macaluso | H04B 3/54 340/12.32 |
| 7,804,248 | B1 * | 9/2010 | Li | H01J 61/30 313/631 |
| 7,804,673 | B2 | 9/2010 | Macaluso et al. | |
| 7,830,248 | B2 | 11/2010 | Logvinov et al. | |
| 8,115,605 | B2 * | 2/2012 | Macaluso | H04B 3/54 340/12.32 |
| 8,674,539 | B1 * | 3/2014 | Magin | H02J 13/0044 307/1 |
| 2002/0050799 | A1 * | 5/2002 | Yamauchi | H05B 37/0245 315/307 |
| 2002/0061012 | A1 * | 5/2002 | Thi | H04B 3/23 370/352 |
| 2003/0169155 | A1 * | 9/2003 | Mollenkopf | G02B 6/483 370/277 |
| 2003/0214250 | A1 * | 11/2003 | Koyama | G09G 3/2022 315/169.3 |
| 2004/0135676 | A1 * | 7/2004 | Berkman | H04B 3/54 370/464 |
| 2004/0227621 | A1 * | 11/2004 | Cope | G02B 6/483 370/487 |
| 2004/0227622 | A1 * | 11/2004 | Giannini | H04B 3/54 375/258 |
| 2005/0043858 | A1 * | 2/2005 | Gelman | H02J 13/0082 700/286 |
| 2005/0200343 | A1 | 9/2005 | Ueda | |
| 2005/0200459 | A1 * | 9/2005 | White, II | G02B 6/483 340/870.09 |
| 2005/0271086 | A1 * | 12/2005 | Macaluso | H04B 3/542 370/480 |
| 2006/0284728 | A1 * | 12/2006 | Rubinstein | H02J 13/0051 375/257 |
| 2007/0047573 | A1 * | 3/2007 | Logvinov | H01R 31/06 370/463 |
| 2008/0158138 | A1 * | 7/2008 | Yamazaki | G02F 1/13318 345/102 |
| 2011/0121654 | A1 * | 5/2011 | Recker | H02J 9/065 307/66 |
| 2011/0133655 | A1 * | 6/2011 | Recker | H02J 9/02 315/159 |
| 2012/0157152 | A1 * | 6/2012 | Blomgren | H04W 52/146 455/522 |
| 2012/0280565 | A1 * | 11/2012 | Logvinov | H05B 37/0254 307/31 |
| 2014/0195577 | A1 * | 7/2014 | Nikitin | H03H 7/0153 708/304 |

FOREIGN PATENT DOCUMENTS

| | | |
|---|---|---|
| CN | 203563092 U | 4/2014 |
| JP | 2004-140756 A | 5/2004 |
| JP | 2007-228440 A | 9/2007 |
| JP | 2008-219502 A | 9/2008 |
| JP | 2009-141415 A | 6/2009 |
| JP | 2009-284158 A | 12/2009 |
| JP | 2012-105275 A | 5/2012 |
| WO | 2008/011891 A1 | 1/2008 |

OTHER PUBLICATIONS

European Search Report dated Mar. 5, 2014 for corresponding EP Application No. 13189409.9, 6 pages.

Japanese Notice of Reason for Rejection, dated Dec. 12, 2017, for Japanese Application No. 2013-211156, 6 pages. (with English translation).

European Communication under Rule 71(3) EPC, Intention to Grant, dated Oct. 19, 2017 for European application No. 13 189 409.9, 35 pages.

Japanese Search Report, dated Oct. 16, 2017, for Japanese Application No. 2013-211156, 10 pages. (with English Machine Translation).

* cited by examiner

SYSTEM AND METHOD FOR A POWER LINE MODEM

CROSS-REFERENCE TO RELATED APPLICATION

This application is a continuation of U.S. patent application Ser. No. 13/656,369, filed Oct. 19, 2012, now allowed, which application is incorporated herein by reference in its entirety.

BACKGROUND

Technical Field

This invention relates generally to electronic circuits, and more particularly to a system and method for a power line modem.

Description of the Related Art

Digital and analog data communications over conventional utility and premises electric power lines is an established method for point-to-point and point-to-multipoint communications between devices. In such communications, a communication signal carrying data is superimposed on a 50 to 60 Hz alternating current (AC) power line using higher frequencies. A central computer may use such a power line communications system to control remote power applications, to monitor remote utility usage, or to support energy conservation. For example, the central computer may control the operation of heaters, air-conditioners, electric lighting and the like. The power line communications system may also be used to support high-speed broadband data to support Internet, multimedia and home entertainment systems, using a power line communication network such as IEEE 1901, IEEE P1901.2, HomePlug GP/AV/AV2/1.0, G.hn, G.hnem, and other similar technologies.

The throughput of a power line communication link, such as a link between two modems or network nodes, may be affected by environmental electrical interference and may suffer degradation when the level of interference is high. For example, when an appliance, such as a television or computer, is attached to the power line in the general proximity of the point where the modem is attached to the same power line, switching noise from the switched-mode power supply of the appliance may create disturbances on the power line that reduce the signal to noise ratio and the bandwidth available to the power line modem. In some cases, these disturbances may be exacerbated when there is high attenuation of data signals superimposed on the power line.

BRIEF SUMMARY

In accordance with an embodiment, a method of operating an electronic system includes detecting an incoming transmission on a power line, and modifying a switching behavior of a switched-mode power supply coupled to the power line upon detecting the incoming transmission. Modifying reduces the level of interference produced by the switched-mode power supply.

BRIEF DESCRIPTION OF THE SEVERAL VIEWS OF THE DRAWINGS

For a more complete understanding of the present disclosure, and the advantages thereof, reference is now made to the following descriptions taken in conjunction with the accompanying drawings, in which.

Figure 1A:
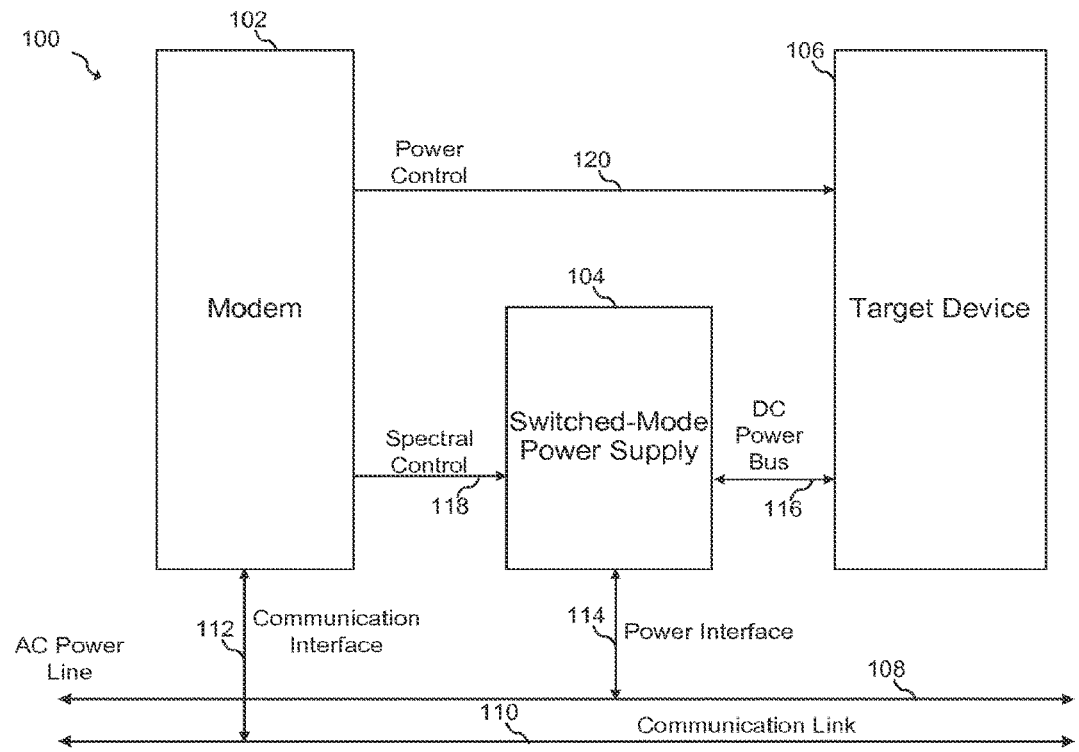
FIGS. 1a-c illustrate embodiment power line communication nodes.

Corresponding numerals and symbols in different figures generally refer to corresponding parts unless otherwise indicated. The figures are drawn to clearly illustrate the relevant aspects of embodiments of the present invention and are not necessarily drawn to scale. To more clearly illustrate certain embodiments, a letter indicating variations of the same structure, material, or process step may follow a figure number.

DETAILED DESCRIPTION

The making and using of embodiments are discussed in detail below. It should be appreciated, however, that the present invention provides many applicable inventive concepts that may be embodied in a wide variety of specific contexts. The specific embodiments discussed are merely illustrative of specific ways to make and use the invention, and do not limit the scope of the invention.

The present disclosure will be described with respect to embodiments in a specific context, namely a system and method for a power line modem. Embodiments of this invention may also be applied to other circuits and systems, such as, but not limited to, communication systems and switched-mode power supplies.

Generally, embodiments of the invention effect operating parameters of a switched-mode power supply in such a way that the switched-mode power supply creates less power line noise. By creating less power line noise, a higher SNR and/or more bandwidth is available to the power line communications system. These operating parameters may be modified when a packet is received by the power line modem. For example, when a power line modem detects a preamble of a received packet, one or more different actions may be taken to reduce the effect of power line noise on a received data transmission. When the modem detects the end of the packet, the power supply and appliance may be returned to normal operation. In some embodiments, these packets may be divided and transmitted and received as pieces in multiple frames.

In an embodiment, frequency fluctuation of the switched-mode power supply may be suspended. This frequency fluctuation refers to harmonic spreading used by many power supplies to reduce peak harmonic energy. By suspending this frequency fluctuation, more bandwidth could be available for power line communications. In multi-carrier systems, such as OFDM, carriers that occupy frequencies between center frequencies of harmonics can be utilized for data transmission with a higher SNR.

Another embodiment method to reduce the effect of power line noise on received data is by reducing the DC power supply power output of the switched-mode power supply. By reducing the power output, the overall level of switching energy is reduced. This lowers that disturbance noise floor and allows the more bits to be transmitted. For example, in some embodiment OFDM systems, a more complex constellation and/or less aggressive coding may be used in the presence of a higher SNR to improve throughput. In other embodiment OFDM systems, a smaller constellation and more aggressive coding scheme can be maintained in order to realize lower error rate, for example, in high QoS applications.

In an embodiment, this reduction in DC power supply output may be effected by reducing the load on the switched-mode power supply. An appliance coupled to the switched-mode power supply may be placed into a momentary low-power mode for the duration of the received packet. For example, in a LED backlit television set, the LED backlight may be shut off or its intensity reduced during the duration of the received packet. Because the length of a received packet is very short, for example 500 us, the reduction in illumination may be imperceptible by the human eye. In some embodiments, power is reduced by 10% to 20%.

In an embodiment, information related to the status of the rendering device, such as a television set, decisions can be made regarding the levels of power reduction in order to take into account artifacts stemming from power reduction, such as visible flicker effects. As such, embodiment power reduction methods may provide a more substantial power reduction during these times when visual artifacts are less pronounced, for example, when an arrival of a transmission occurs during a transition from one image to another, or when a dark image is displayed.

A reduction in the DC power supply output may also be implemented by momentarily suspending switching on the DC power supply. During the short period of time that the modem receives a packet, switching is suspended on the DC power supply. Capacitors coupled to the DC output of the switched-mode power supply may used during this time to supply the appliance with power. Such an embodiment may be applied, for example, to consumer audio applications. While an audio system is constantly receiving audio packets and, in some cases in bursts of audio packets, power requirements of an audio amplifier greatly depend on the pattern of the audio signal that may include periods of high and low audio intensity. During such low intensity periods, a greater degree of power output reduction is possible. In some embodiments, data receive and transmit operations may be synchronized with the audio pattern rendered by the device. As an example, a power line communication node coupled with an audio system may schedule transmissions during the periods of high audio intensity, and receive transmissions during periods of low audio intensity. Consequently, such a power line communication block may consume more power during data transmission, and less power during data reception. By handling transmissions during quieter periods of rendered audio, a device may reduce its peak power consumption. Such embodiment transmission schemes may also be applied to other media types, such as video. For example, transmissions may be performed during quieter periods of video data or other media. Such quieter periods may represent periods in which picture has a lower light intensity. In some embodiments transmission and receiving operations may be scheduled such that that the pattern of said operations is synchronized with the known or detected pattern of the intensity of the content rendered by the device. The content may be audio, video, light emission, or other content.

In embodiments systems having transmission structures that combine receive and transmit operations, sufficient power may be provided to a target device while power savings modes are being asserted. For example, in HomePlug AV a receive operation is typically followed by a transmission of an acknowledgement (ACK) signal. As such, periods during which a switched-mode power supply operates in a reduced power mode is followed by periods during which the switched-mode power supply may output more power. In some embodiments, these ACK signals may be deferred or delayed in order to give the switched-mode power supply an opportunity to recover from a reduced power mode.

The DC switching behavior of the DC power supply may be further modified in other ways. For example, in an embodiment, the transmission frequency of the power line communication device may be coordinated with a switching frequency of the DC power supply, such that the transmission frequency of the power line communication device does not fall on a harmonic or other spurious tone generated by the DC power supply. In one embodiment, the both the transmission frequency and the DC power supply switching frequency are scheduled according to pre-programmed frequency hops. By operating the communication system according to a pre-programmed frequency hop pattern, spurious energy emitted by the DC power supply may be kept below a particular threshold to comply with emissions standards as well as reducing interference with data communications. Power line communication systems such as HomePlug AV as an example allow "slicing" of the line cycle into multiple time intervals during which a unique tone map (configuration of modulation density per carrier) may be used. The frequency hop pattern serves to spread harmonic energy of the DC switched-mode power supply over a wider bandwidth, thereby reducing the peak power spectral density of emissions averaged over time, and the relationship between the hopped switching frequencies to the hopped data transmission frequencies avoids interference between the switching of the DC power supply and an incoming or outgoing data transmission. In some embodiments, this frequency hop pattern may be set to prevent average emissions from exceeding a threshold.

In an embodiment, the pre-programmed frequency hops. In an embodiment, the determination and scheduling of frequency hops may be performed according to a preset schedule, according to a synchronized pseudorandom process using, for example, a linear feedback shift registers, a frequency hop scheduled programmed in a lookup table, or by another synchronized process known in the art. In some embodiments, an adaptive process may be used that detects problematic frequencies and omits these problematic frequencies in the hopping schedule. For example, in some embodiments, the RF frequencies may be scanned for pre-existing spurious emissions from other sources, or for frequencies having high attenuation and/or poor propagation properties due to multipath interference. Frequency hopping may be scheduled such that the interference produced by the switched-mode power supply falls onto frequencies that are highly attenuated, have high noise levels, and/or may be unsuitable for communication. In some embodiments, channel quality-based frequency hopping may be performed in conjunction with existing standards-compatible channel quality measurement schemes. For example, according to the HomePlug AV standard, a channel analysis may be performed when a link is established between two devices. This channel analysis provides a list of possible modulation densities for each carrier. In an embodiment directed toward HomePlug AV and similar devices, the results of the channel analysis may be used to determine a frequency hopping schedule. For example, frequencies associated with carriers identified as having a low modulation density may be selected as the list of preferred frequencies, and hoping will be managed in such way that the harmonics of the switching power supply will fall on these preferred frequencies. In some embodiments, a table listing the output of the channel analysis may be used as an input to identify the relative performance of candidate frequency carriers, for example, by ranking the candidate frequency carriers according to channel quality. As such, an effective frequency hopping schedule may be determined with low processing overhead. It should be appreciated that in other embodiments directed toward other standards, existing channel analysis resources may also be used.

In an embodiment, the switched-mode power supply may operate according to default frequency spreading schedule, and then synchronize to a further spreading schedule and/or resynchronize to an existing spreading schedule when the power line communications modem is about to transmit and/or receive data.

Embodiments of the present invention may be directed toward devices that may be configured to operate on a power line network, for example, consumer electronic devices, multimedia devices and television sets, computing devices, appliances such as refrigerators, washing machines, dryers, HVAC equipment and lighting systems such as LED or CFL lighting. Devices, such as computing devices may use the power line network to communicate with or to control other devices and appliances on the power line network and/or to access a local area or wide area network, such as the Internet. Appliances and lighting systems may use the network, for example, to coordinate power management as described in U.S. patent application Ser. No. 13/461,173 entitled "System and Method for an Intelligent Power Controller" filed on May 1, 2012, which has been incorporated by reference herein in its entirety.

FIG. 1a illustrates embodiment system 100 having modem 102, switched-mode power supply 104 and a target device 106. As shown, switching power supply 104 is coupled to AC power line 108 via power interface 114, and modem 102 is coupled to communication link 110 via communication interface 112. Target device 106, which may include an appliance or other device, receives power from switched-mode power supply 104 via DC power bus 116. Communication link 110 may be implemented using a wired local area network connection such as Fast Ethernet, a wireless local area network, such as an 802.11 WiFi or ZigBee network, or using a power line communication network such as IEEE 1901, IEEE P1901.2, HomePlug GP/AV/AV2/1.0, G.hn, G.hnem, and other similar technologies. Alternatively, other network technologies or communication links may be used, such as Ethernet and the like. In the case of a power line communication network, such as an IEEE 1901 network, modem 102 may be a power line modem and communication link 110 may be physically implemented using the same physical line as AC power line 108.

When modem 102 detects an incoming transmission, Spectral Control signal 118 is activated, thereby causing the switched-mode power supply to modify its operation in order to provide less noise and/or more bandwidth for the power line modem. Alternatively, Spectral Control 118 may cause switched-mode power supply 104 to synchronize a frequency hopped switching frequency pattern with the transmission or reception frequency used by modem 102. Modem 102 may also signal target device 106 to operate in a low power mode during the duration of the reception of a receive packet or a transmission of a transmit packet via Power Control signal 120.

Figure 1B:
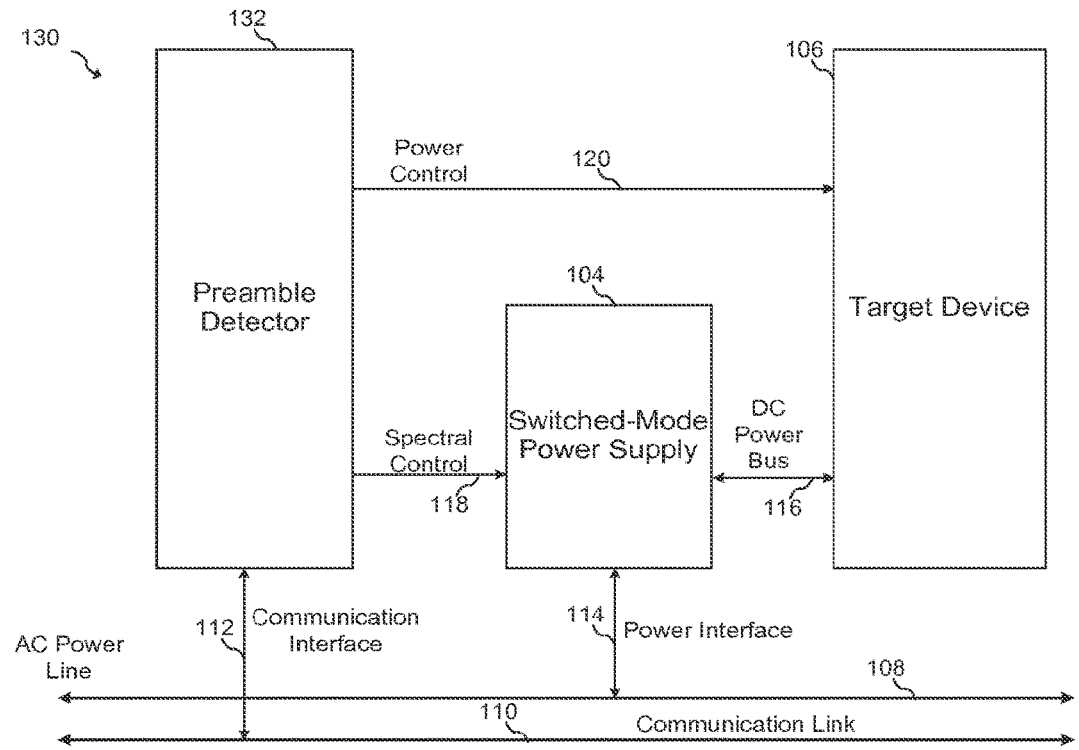

FIG. 1b illustrates embodiment system 130 in which preamble detector 132 is coupled to communication link 110 via communication interface 112, to switched-mode power supply via Spectral Control signal 118, and to target device 106 via power control signal 120. In an embodiment, preamble detector 132 detects the preamble of incoming data packets and places switched-mode power supply and target device 106 in an appropriate state. In some embodiments, preamble detector 132 may have a subset of the functionality of modem 102 shown in FIG. 1a. In some embodiments, power mode selection methods may be applied to transmission and packet detection, as described in U.S. Pat. No. 8,115,605, entitled, "Power line communications device in which physical communications protocol layer operation is dynamically selectable," which application is incorporated herein by reference in its entirety.

Figure 1C:
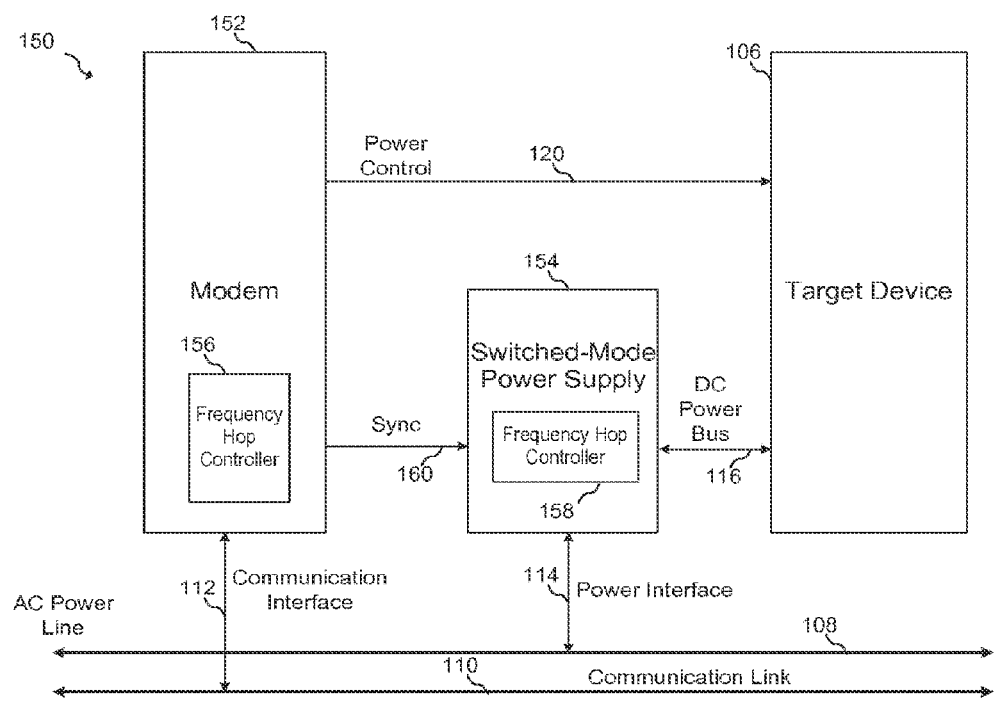

FIG. 1c illustrates embodiment system 150 configured to operate using a frequency hopped sequence. In an embodiment, modem 152 has frequency hop controller 156, and switched-mode power supply 154 has frequency hop control 158. In some embodiments, modem 152 asserts sync signal 160 when an incoming packet is detected.

When switched-mode power supply detects sync signal 160, a predetermined frequency hop sequence is commenced, such that frequency control sequences generated by frequency hop controller 156 and frequency hop controller 158 are synchronized. Frequency hop controllers 156 and 158 may be further synchronized with a frequency hop controller of the transmitting node from which modem 152 receives its data. In alternative embodiments, frequency hop controllers 156 and 158 may be further synchronized at times during which modem 152 is not receiving data, for example, during idle periods and/or during data transmission periods.

Figure 2:
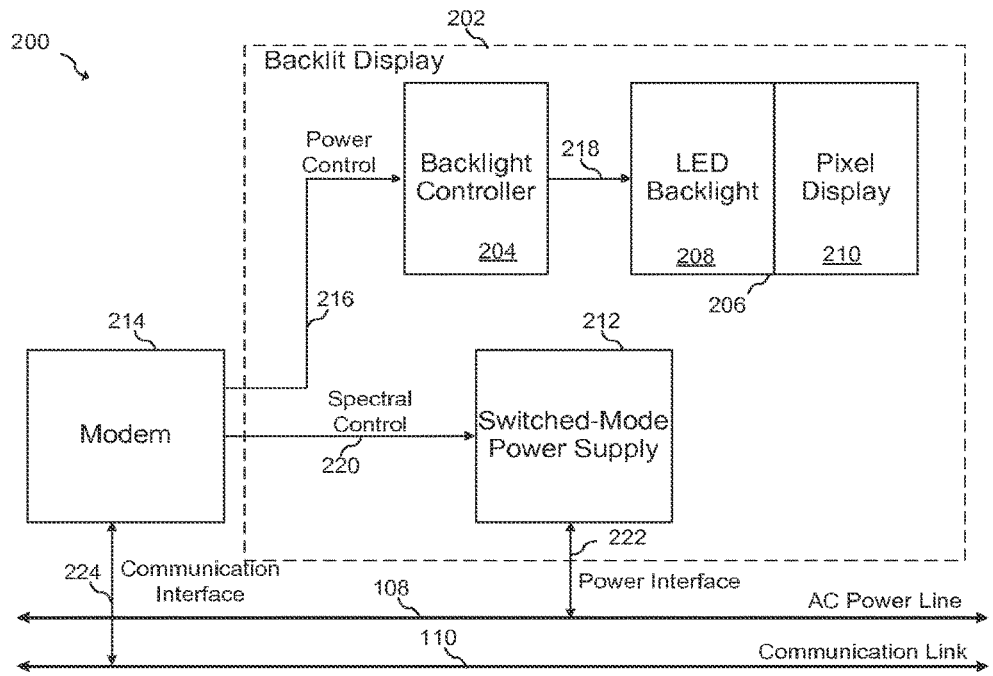
FIG. 2 illustrates an embodiment backlit display.

FIG. 2 illustrates block diagram of an LED backlit display system 200 that includes backlit display 202 coupled to modem 214. In an embodiment, LED backlit display system 200 has backlight controller 204 coupled to display 206 via signal 218. Display 206 includes LED backlight 208 and pixel display 210. Switched-mode power supply 212 is coupled to AC power line 108 via power interface 222, and modem 214 is coupled to communication link 110 via communication interface 224, to switched-mode power supply 212 via Spectral Control signal 220, and to backlight controller 204 via power control signal 216. In some embodiments, about 90% of the power being consumed by the switched-mode power supply is provided to the LED backlight. When modem 214 detects a received transmission, the operation of the switched-mode power supply is modified to produce less switching noise by momentarily reducing the intensity of the light LED backlight via the backlight controller. In further embodiments, switched-mode power supply 212 may operate with a frequency hopped switching frequency scheme as described above. For example, switched-mode power supply 212 may synchronize its hopped switching frequency scheme when spectral control signal 220 indicates an incoming received packet and/or an outgoing transmitted packet.

Figure 3:
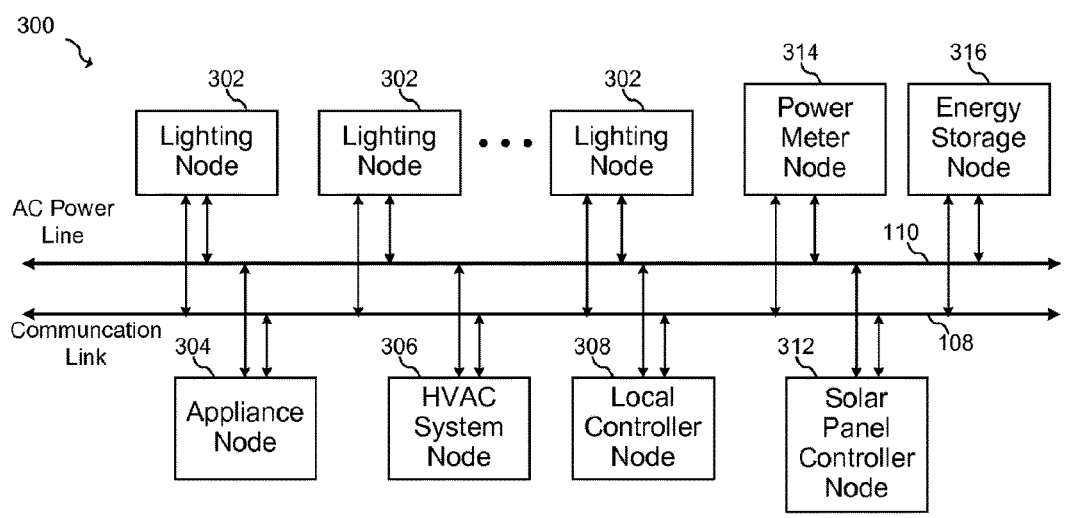
FIG. 3 illustrates an embodiment power line communication system.

FIG. 3 illustrates a block diagram of embodiment power line communications network 300 that includes a number of lighting nodes 302, networked appliance 304, HVAC system 306, local controller 308 (such as a user terminal), power meter 314, solar panel controller 312, and energy storage device 316. Energy storage device 316 may include a battery, but may also represent an electric car that consumes power from AC power line 108 during some time periods, and/or makes power available to the network via AC power line 108 during other time periods. The devices coupled to AC power line 108 communicate with each other over communication link 110, which may be implemented using a wired or wireless network medium as described with respect to FIG. 1a above. It should be understood that network 300 is just one of many examples of an embodiment power line communications network, and that in alternative embodiments, any number of lighting nodes 302 or other devices, may be coupled to power line 108. Alternatively, power line 108 may be implemented using a DC power line, or other power distribution type including wireless power.

Figure 4A:
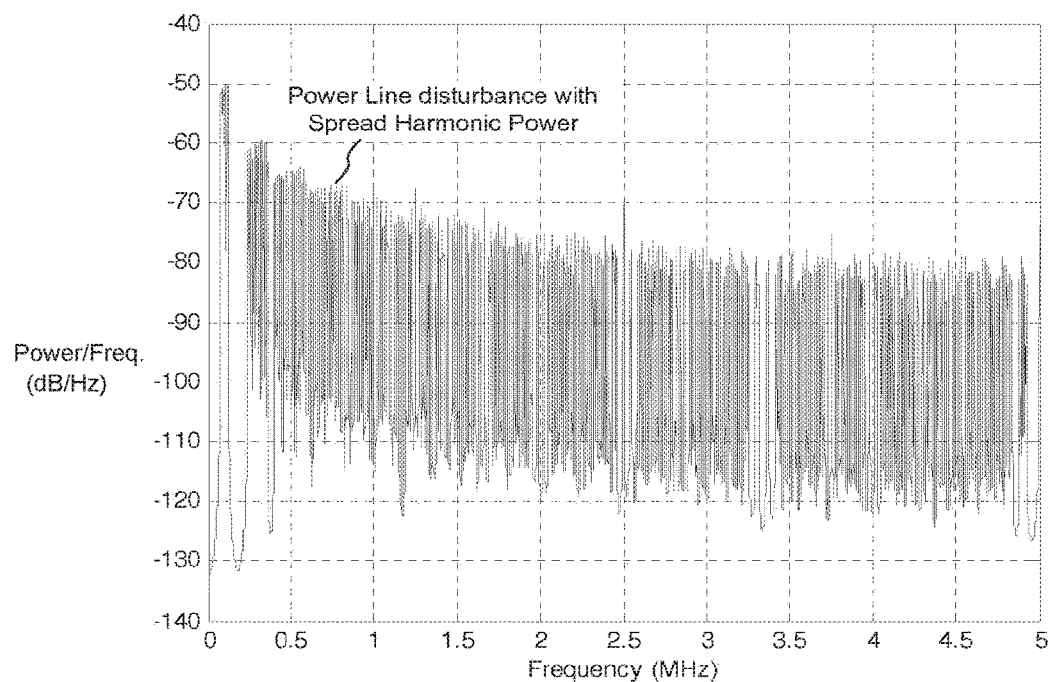
FIGS. 4A-4B illustrate example spectra of a switched-mode power supply.

FIG. 4A illustrates an example output spectrum of a switched-mode power supply operating in a "spread spectrum" state, which may be implemented using frequency hopping spread spectrum techniques, direct sequence spread spectrum techniques, pulse position modulation of the switching signal for the switched-mode power supply and/or other techniques known in the art. Here, a wideband flat spectrum is shown extending from around a switching frequency of a power supply to over 50 MHz. It should be understood that other switching noise bandwidths and spectral shapes may also be possible.

Figure 4B:
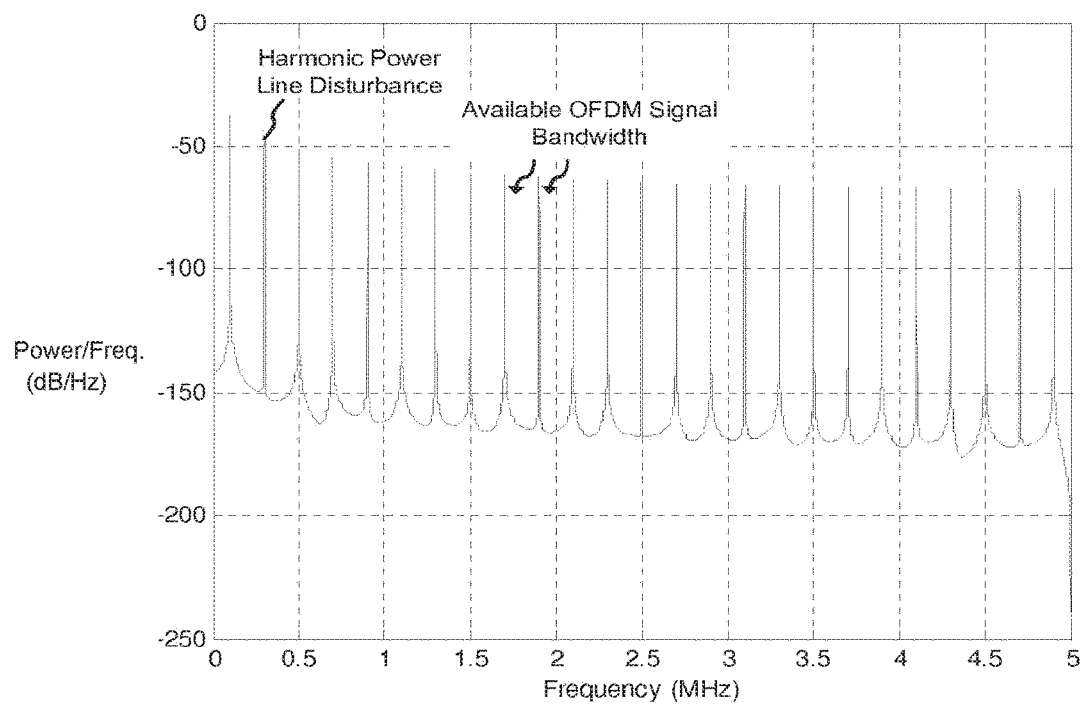

FIG. 4B illustrates example output spectra of a switched-mode power supply without spreading of the harmonic spectrum with and without the activation of an embodiment reduced power mode. FIG. 4B further illustrates carriers available for OFDM power line communications. In some embodiments, the available OFDM bandwidth may be used by selecting OFDM tones that are not coincident with harmonic power line disturbance tones.

Figure 5:
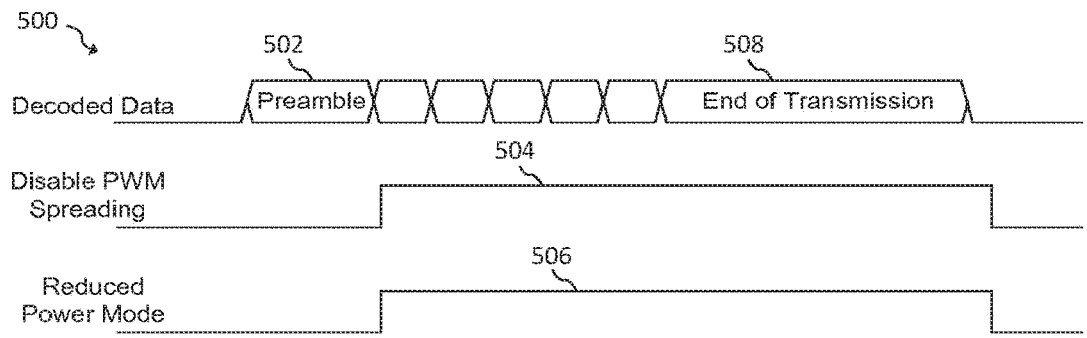
FIG. 5 illustrates an embodiment waveform diagram showing a relationship between a received packet and embodiment control signals.

FIG. 5 illustrates a waveform diagram 500 showing an example received packet and an example timing relationship between the received packet and embodiment control signals. In an embodiment, Disable PWM Spreading signal 504 and Reduced Power mode signal 506 becomes asserted after the completion of preamble 502 of incoming Decoded Data. At the completion of End of Transmission indicator 508, Disable PWM Spreading signal 504 and Reduced Power mode signal 506 is de-asserted.

Figure 6:
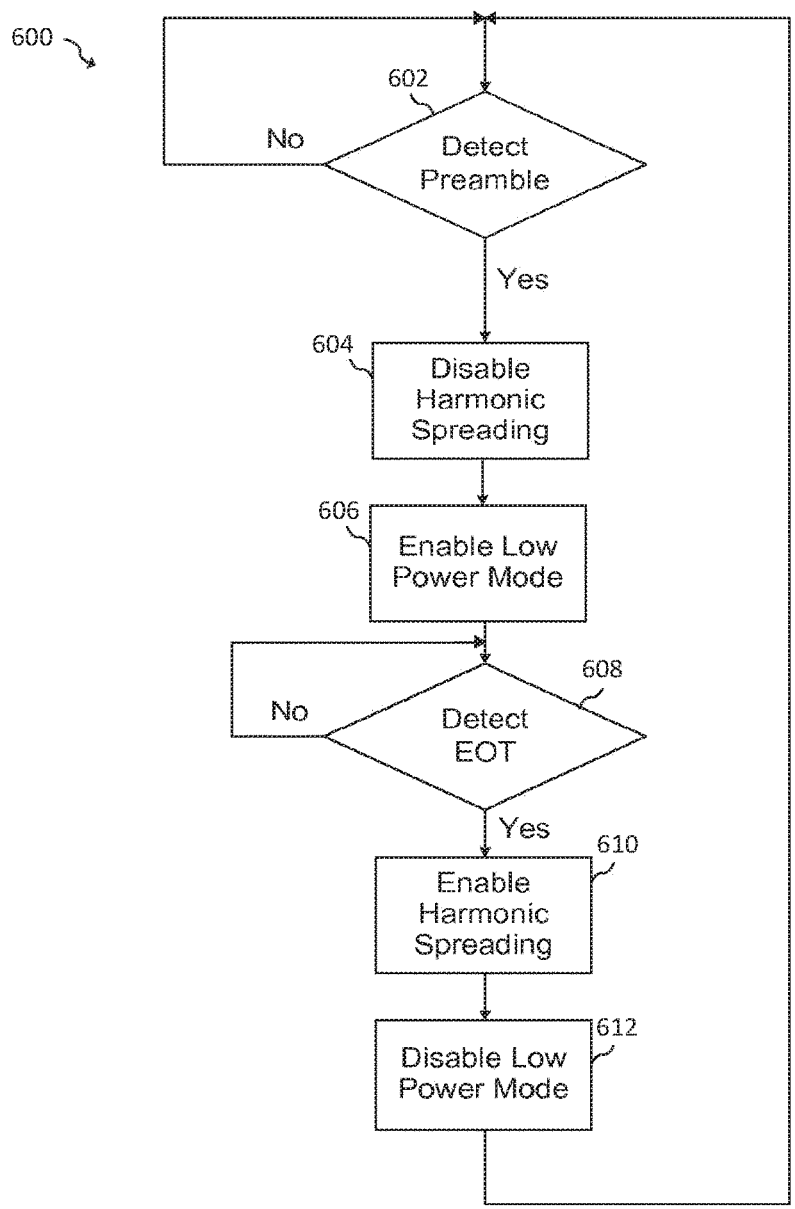
FIG. 6 illustrates a flowchart of an embodiment method.

FIG. 6 illustrates flow chart 600 of an embodiment method. In step 602 the existence of a preamble is detected. This preamble may be similar, for example, to preamble 502 shown in FIG. 5. Once the preamble has been detected, harmonic spreading is disabled in the switched-mode power supply during step 604. In step 606, a low power mode may be enabled within a target device coupled to the modem and the switched-mode power supply. In some embodiments of the present invention, step 604 or 606 may be omitted depending on the particular embodiment and its requirements. Next, in step 608, the end of transmission segment is detected. When the end of transmission of the data segment is detected, harmonic spreading is enabled in step 610 and the low-power mode is disabled in step 612.

In accordance with an embodiment, a method of operating an electronic system includes detecting an incoming transmission on a power line, and modifying a switching behavior of a switched-mode power supply coupled to the power line upon detecting the incoming transmission. Modifying reduces the level of interference produced by the switched-mode power supply, and may be implemented, and may improve the receiving capabilities of the electronic system as a result. In some cases, modifying the switching behavior is achieved by disabling harmonic spreading.

In an embodiment, the method includes reducing a power output of the switched-mode power supply upon detecting the incoming transmission. Reducing the power output may include reducing a power consumption of a load coupled to a DC output of the switched-mode power supply. Such a reduction in power consumption in the load may include reducing a power consumption of a backlight of a video display device. In an embodiment, reducing the power consumption of the backlight includes reducing the power consumption of the backlight proportional a darkness of a currently displayed image, and further reducing the power consumption of the backlight when the incoming transmission occurs during a transition from a first image to a second image.

In other embodiments, reducing the power consumption of the load includes reducing a power consumption of a media device. For example, the media device may be an audio device, and the power consumption of the audio device is reduced by reducing the power consumption of the audio device inversely proportional to an amplitude of an audio signal rendered by the audio device. Furthermore, data transmissions may be synchronized according to the media signal rendered by the media device. The method may further include determining a pattern of content intensity of the media signal, and synchronizing the data transmissions according to the determined pattern.

In an embodiment, an acknowledgement (ACK) signal is transmitted in response to receiving the incoming transmission. The method may further include reducing a power output of the switched-mode power supply upon detecting the incoming transmission, increasing the power output of the switched-mode power supply after the incoming transmission has been received, and delaying transmitting the ACK signal until after increasing the power output.

In accordance with a further embodiment, a system includes a transmission detector that is configured to be coupled to a power line, such that the detector is configured to detect a received data transmission on the power line. The transmission detector may include a first output configured to be coupled to a switched-mode power supply, and the first output may be configured to signal the switched-mode power supply to modify switching to reduce the levels of interference of the power supply. The transmission detector may include a power line modem, and may be configured to detect a preamble of an incoming data packet.

The transmission detector may further include a second output configured to be coupled to a load coupled to the switched-mode power supply, such that the second output is configured to signal the load to reduced power consumed from the switched-mode power supply.

In accordance with another embodiment, system includes a transmission detector configured to be coupled to a power line, and is configured to detect a received data transmission on the power line and indicate via a first output signal that a data transmission is being received. The system also includes a switched-mode power supply coupled to the first output signal that is configured to be coupled to the power line. The switched-mode power supply modifies its switching behavior when the first signal indicates a data transmission is being received, such that more channel resources are available for the data transmission being received.

In some embodiments, the switched-mode power supply disables harmonic spreading when the first signal indicates that a data transmission is being received. Furthermore, wherein the transmission detector may be configured to detect a received transmission by detecting a preamble of the received transmission before the received transmission has been completely received.

In accordance with a further embodiment, a method of operating an electronic system includes detecting a start of an incoming data transmission on a power line using a first receiver, determining modulation densities associated with one or more carriers on which data is being received, and setting a switching behavior of a switched-mode power supply coupled to the first receiver based on the determining. The method may also include setting the switching frequency of the power supply, such that harmonics produced by the power supply fall on frequencies associated with the carriers that have the lowest modulation densities. Setting the switching behavior of the switched-mode power supply may include adjusting a switching frequency of switched-mode power supply to avoid interference with the received data transmission.

In an embodiment, the switching frequency of the power supply may be set according to a hop sequence. Accordingly, outgoing data may be transmitted using a transmission frequency based on the hop sequence. For example, the method may include determining the hop sequence by measuring or extracting an already measured channel quality of a plurality of candidate frequency carriers, ranking the candidate frequency carriers according to measured channel quality, and selecting candidate frequency carriers having a low rank for the hop sequence.

In accordance with another embodiment, a system includes a receiver and a switched-mode power supply control module coupled to the receiver. Some embodiments may also include a switched-mode power supply. The receiver may be configured to be coupled to a power line, receive an incoming data transmission on a power line, and determine a reception frequency of the received data transmission. The switched-mode power supply control module may be configured to modify a switching behavior of a switched mode power supply based on the determined reception frequency. In addition, the receiver may be configured to determine the reception frequency based on a predetermined hop sequence that may be determined according to a channel profile, such that harmonics of switching frequencies of the switched mode power supply are configured to fall on frequencies associated with carriers having lowest modulation densities.

The system may further include a transmitter configured to transmit an outgoing data transmission using a transmission frequency based on the predetermined hop sequence. In some embodiments, the switched-mode power supply control module may be configured to modify the switching behavior by adjusting a switching frequency of the switched-mode power supply to avoid interference with the received data transmission.

Advantages of embodiments include the ability to achieve high quality power line communications with appliances that generally emit high levels of power line interference. Another advantage includes the ability to greatly improve throughput and available bandwidth for power line communications, thereby providing better performance. Further advantages of some embodiments include an improvement in the overall power management of a device by reducing the peak power consumption. For example, a power line communication block of a system may consume more power during data transmission, and less power during data reception. By handling transmissions during quieter periods of rendered audio, a device may reduce its peak power consumption.

The following U.S. Patent Application Publications and U.S. Patents are incorporated herein by reference in their entirety: U.S. Pat. No. 6,917,888, entitled, "Method and system for power line network fault detection and quality monitoring;" U.S. Pat. No. 7,106,177, entitled, "Method and system for modifying modulation of power line communications signals for maximizing data throughput rate;" U.S. Pat. No. 7,193,506, entitled, "Method and system for maximizing data throughput rate in a power line communications system by modifying payload symbol length;" U.S. Pat. No. 7,369,579, entitled, "Method and system for timing controlled signal transmission in a point to multipoint power line communications system;" U.S. Pat. No. 7,683,777, entitled, "Method and system for audio distribution in installations where the use of existing wiring is preferred;" U.S. Pat. No. 7,804,673, entitled, "Intelligent, self-aware power-line conditioning and communication node;" and U.S. Pat. No. 8,115,605, entitled, "Power line communications device in which physical communications protocol layer operation is dynamically selectable." Systems and methods described in the above mentioned U.S. Patents can be applied to embodiments described herein.

It will also be readily understood by those skilled in the art that materials and methods may be varied while remaining within the scope of the present invention. It is also appreciated that the present invention provides many applicable inventive concepts other than the specific contexts used to illustrate embodiments. Accordingly, the appended claims are intended to include within their scope such processes, machines, manufacture, compositions of matter, means, methods, or steps.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method to reduce interference produced by a switched-mode power supply in an Internet-enabled device receiving power from a 50 to 60 Hz alternating current (AC) power line, comprising:
   receiving a communication signal superimposed on the AC power line, the communication signal carrying Internet data;
   detecting a preamble of the communication signal; and
   upon detecting the preamble, reducing communication interference by automatically modifying an operating mode of the switched-mode power supply.

2. The method of claim 1, wherein modifying the operating mode of the switched-mode power supply includes at least one of disabling harmonic spreading of the switched-mode power supply, reducing a power output of the switched-mode power supply, and suspending frequency fluctuation of the switched-mode power supply.

3. The method of claim 2, wherein reducing the power output of the switched-mode power supply includes reducing a power consumption of a load coupled to a DC output of the switched-mode power supply.

4. The method of claim 2, wherein reducing the power output of the switched-mode power supply includes at least one of reducing a power consumption of a backlight of a video display device and reducing a power consumption of an audio device.

5. The method of claim 4, wherein reducing the power consumption of the backlight of the video display device comprises:
   reducing the power consumption of the backlight proportional to a darkness of a currently displayed image; and
   further reducing the power consumption of the backlight when the incoming data transmission occurs during a transition from a first image to a second image.

6. The method of claim 4, wherein reducing the power consumption of the audio device comprises:
   reducing the power consumption of the audio device inversely proportional to an amplitude of an audio signal rendered by the audio device.

7. The method of claim 4, wherein reducing the power consumption of the audio device comprises:
   synchronizing data transmissions according to an audio signal rendered by the media device.

8. The method of claim 4, wherein reducing the power consumption of the audio device comprises:
   determining a pattern of content intensity of the media signal; and
   synchronizing data transmissions according to the determined pattern.

9. The method of claim 2, wherein reducing the power output of the switched-mode power supply comprises:
   supplementing the power output of the switched-mode power supply with power from at least one capacitor.

10. The method of claim 1, wherein the Internet-enabled device is a home appliance, and wherein modifying the operating mode of the switched-mode power supply comprises:
    reducing a power output of the switched-mode power supply upon detecting the preamble;
    increasing the power output of the switched-mode power supply after an incoming data transmission has been received; and
    delaying transmitting an ACK signal until after increasing the power output.

\* \* \* \* \*